(12) United States Patent
Hsu et al.

(10) Patent No.: US 9,899,239 B2
(45) Date of Patent: Feb. 20, 2018

(54) CARRIER ULTRA THIN SUBSTRATE

(71) Applicant: Apple Inc., Cupertino, CA (US)

(72) Inventors: Jun Chung Hsu, Taoyuan (TW); Flynn P. Carson, Redwood City, CA (US); Kwan-Yu Lai, Campbell, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/935,292

(22) Filed: Nov. 6, 2015

(65) Prior Publication Data
US 2017/0135219 A1 May 11, 2017

(51) Int. Cl.
*H05K 3/02* (2006.01)
*H05K 3/10* (2006.01)
(Continued)

(52) U.S. Cl.
CPC ........ *H01L 21/568* (2013.01); *H01L 21/4857* (2013.01); *H01L 21/561* (2013.01); *H01L 23/49822* (2013.01); *H01L 23/552* (2013.01); *H01L 24/97* (2013.01); *H01L 23/3128* (2013.01); *H01L 24/13* (2013.01); *H01L 24/16* (2013.01); *H01L 24/81* (2013.01); *H01L 2224/0401* (2013.01); *H01L 2224/131* (2013.01); *H01L 2224/16235* (2013.01); *H01L 2224/16245* (2013.01); *H01L 2224/81005* (2013.01); *H01L 2224/97* (2013.01); *H01L 2924/1431* (2013.01); *H01L 2924/1434* (2013.01); *H01L 2924/1461* (2013.01);
(Continued)

(58) Field of Classification Search
CPC .... H05K 3/0011; H05K 1/111; H05K 3/0097; B23K 1/10016; B32B 7/04; Y10T 29/4126; Y10T 29/4913; Y10T 29/49155; Y10T 29/49156; Y10T 29/49126
USPC .......... 29/830, 832, 846; 174/250, 255, 260; 428/209; 156/247
See application file for complete search history.

(56) References Cited

U.S. PATENT DOCUMENTS 5,505,321 A * 4/1996 Caron ................. H05K 3/0097
174/250
7,148,561 B2 12/2006 Huang et al.
(Continued)

FOREIGN PATENT DOCUMENTS

| JP | 5092662 B2 | 4/2009 |
|---|---|---|
| JP | 2013-239677 | 11/2013 |
| WO | WO 2012/043742 A1 | 4/2012 |

OTHER PUBLICATIONS

PCT International Search Report and Written Opinion for International Application No. PCT/US2016/051479, dated Nov. 22, 2016, 13 pages.

(Continued)

*Primary Examiner* — Donghai D Nguyen
(74) *Attorney, Agent, or Firm* — Rutan & Tucker, LLP

(57) ABSTRACT

Method of forming ultra thin coreless substrates are described. In an embodiment, the method utilizes a debond layer including high and low adhesion surface areas to the carrier substrate, and cutting through the low adhesion surface areas to remove a build-up structure from the carrier substrate. An electrical short layer may be formed as a part of or on the debond layer to facilitate electrical testing of the build-up structure prior to debonding, and aid in the formation a "known good" substrate on a support substrate.

17 Claims, 13 Drawing Sheets

(51) Int. Cl.
*H01L 21/56* (2006.01)
*H01L 23/498* (2006.01)
*H01L 21/48* (2006.01)
*H01L 23/552* (2006.01)
*H01L 23/31* (2006.01)
*H01L 23/00* (2006.01)
*H05K 3/46* (2006.01)

(52) U.S. Cl.
CPC ............... *H01L 2924/15311* (2013.01); *H01L 2924/3025* (2013.01); *H05K 3/4682* (2013.01); *Y10T 29/49156* (2015.01)

(56) References Cited

U.S. PATENT DOCUMENTS

| | | | |
|---|---|---|---|
| 7,594,317 B2 | 9/2009 | Nakamura | |
| 8,237,056 B2* | 8/2012 | Niki | B23K 1/0016 29/843 |
| 8,394,225 B2* | 3/2013 | Nakamura | H05K 3/4652 156/182 |
| 8,563,141 B2* | 10/2013 | Lee | B32B 7/04 428/209 |
| 2007/0124924 A1 | 6/2007 | Nakamura | |
| 2010/0096078 A1 | 4/2010 | Nakamura et al. | |
| 2011/0018123 A1 | 1/2011 | An et al. | |
| 2013/0143062 A1 | 6/2013 | Kaneko et al. | |

OTHER PUBLICATIONS

Garrou, Phil, "ASE Fan Out Chips Last Packaging (FOCLP): A closer look," Yole Développement, Mar. 25, 2015. Web. Sep. 15, 2015, 3 pgs. http://www.i-micronews.com/advanced-packaging-news/5296-ase-fan-out-chips-last-packaging-foclp-a-closer-look.html.

Garrou, Dr. Phil, "IFTLE 233 Package Shrinkage Continues with ASE FOCLP," Solid State Technology, Insights from Leading Edge, 2015. Web. Sep. 15, 2015, 3 pgs. http://electroiq.com/insights-from-leading-edge/2015/03/iftle-233-package-shrinkage-continues-with-ase-foclp/.

Kumbhat, et al., "Chip-Last Fan-out package with Embedded power ICs in Ultra-Thin Laminates," IEEE, 2012 pp. 1372-1377.

Manusharow, et al., "Coreless Substrate Technology Investigation for Ultra-Thin CPU BGA Packaging," IEEE, 2012, pp. 892-896.

Vardaman, E. Jan, "Advance Packaging Developments: Will It Be FO-WLP, FC-CSP, or 3D IC?" TechSearch International, Inc., 2014, 25 pgs.

* cited by examiner

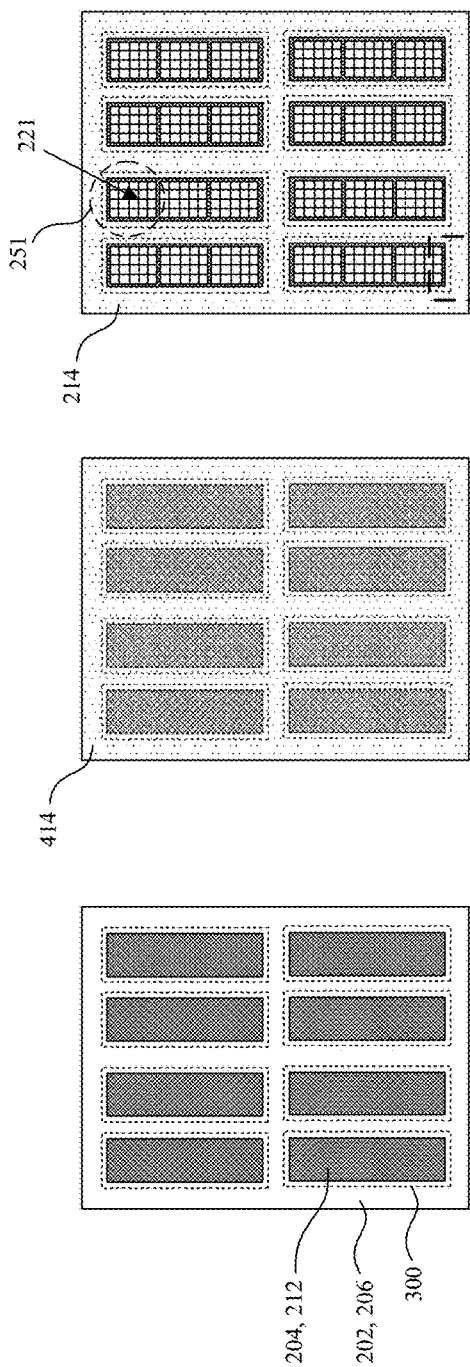
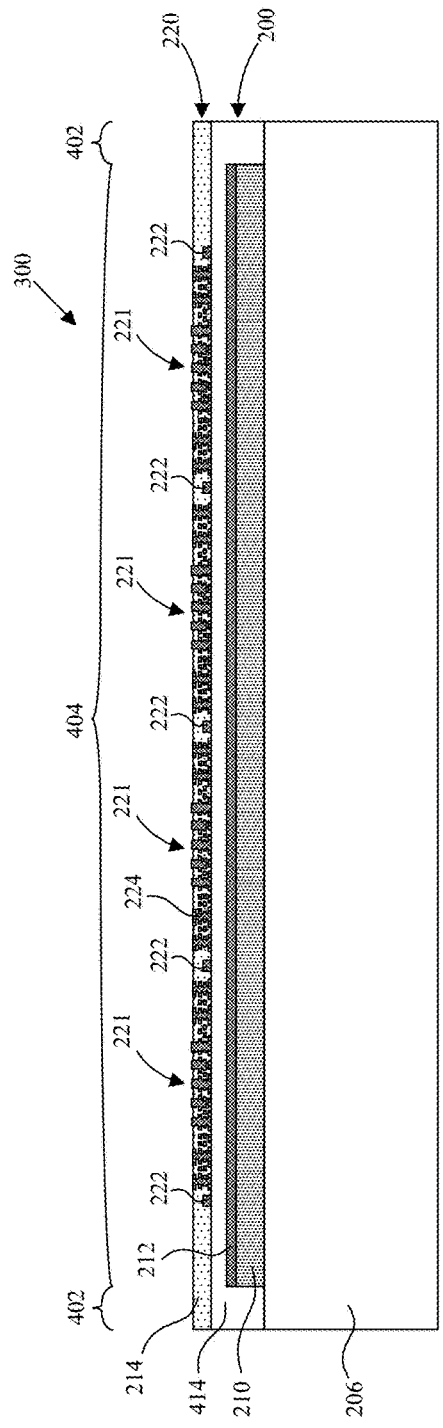

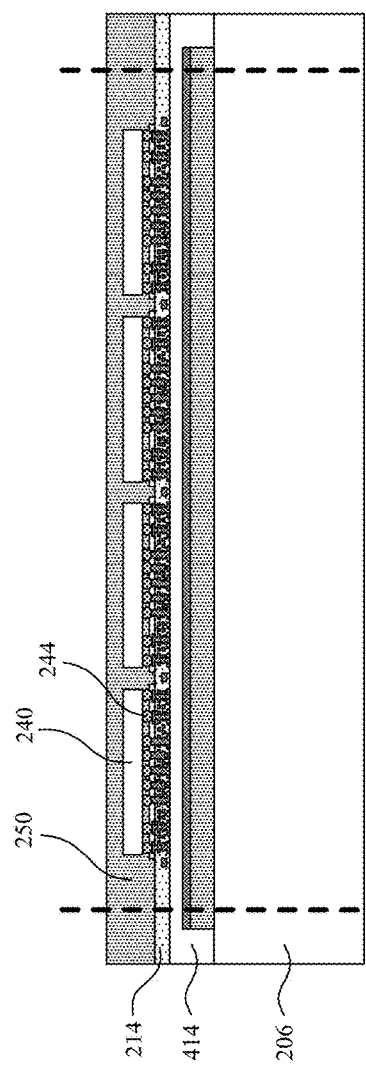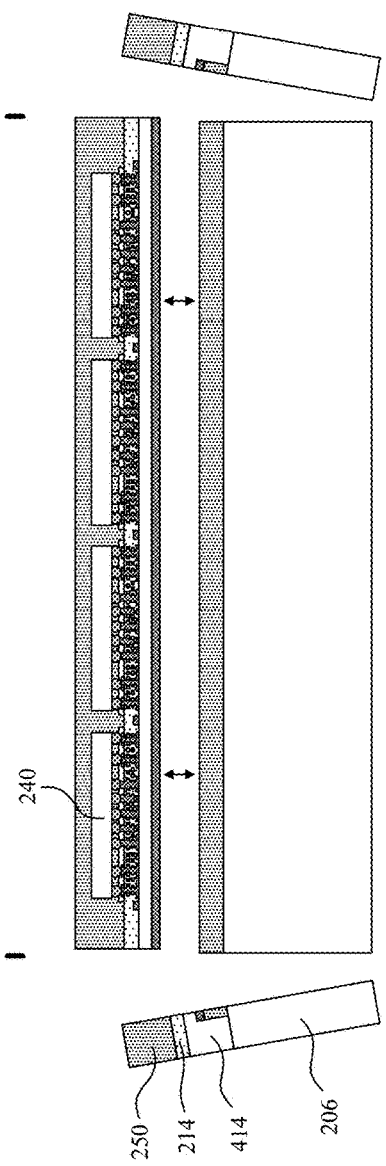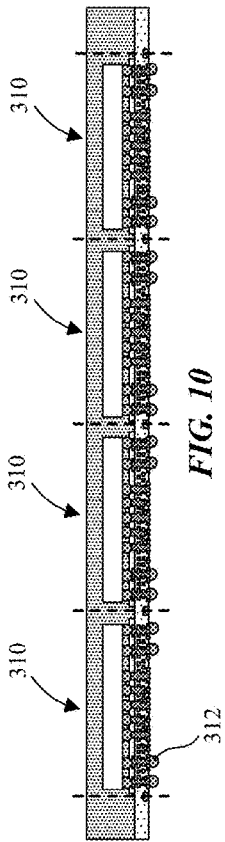

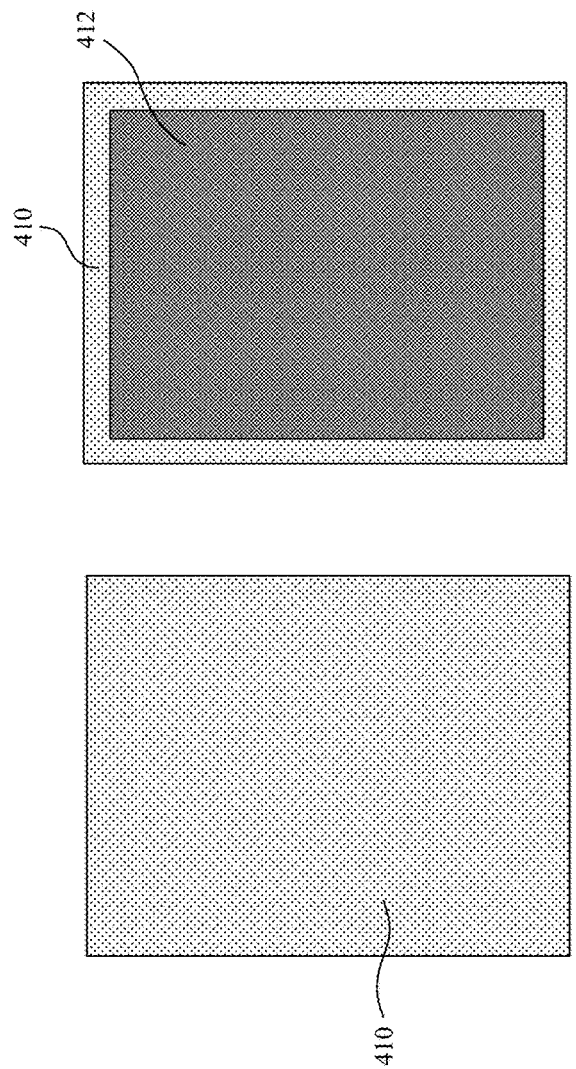
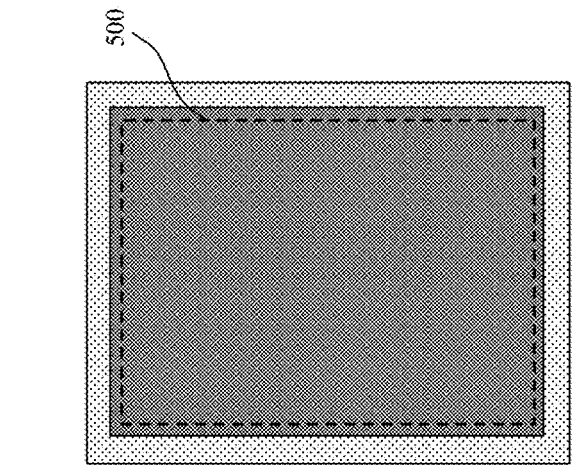
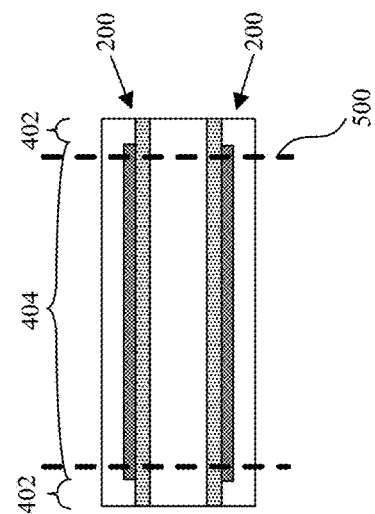
FIG. 13A
FIG. 14A
FIG. 15A
FIG. 13B
FIG. 14B
FIG. 15B

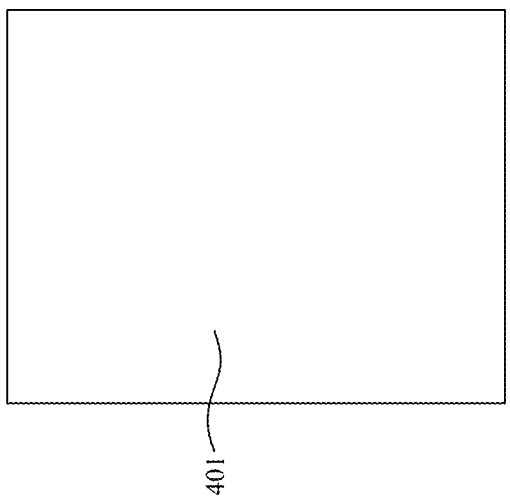
FIG. 19A
FIG. 19B
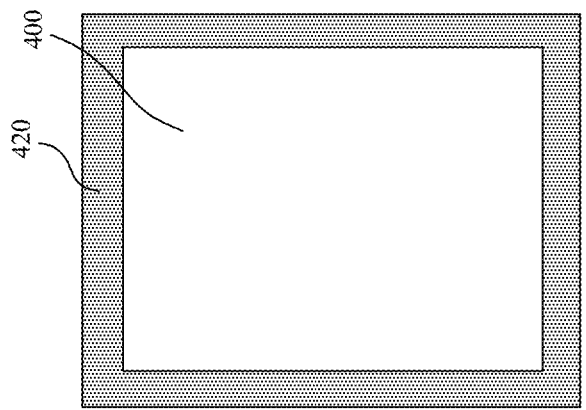
FIG. 20A
FIG. 20B
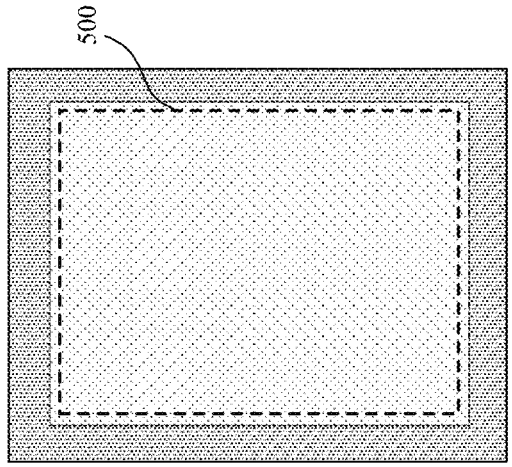
FIG. 21A
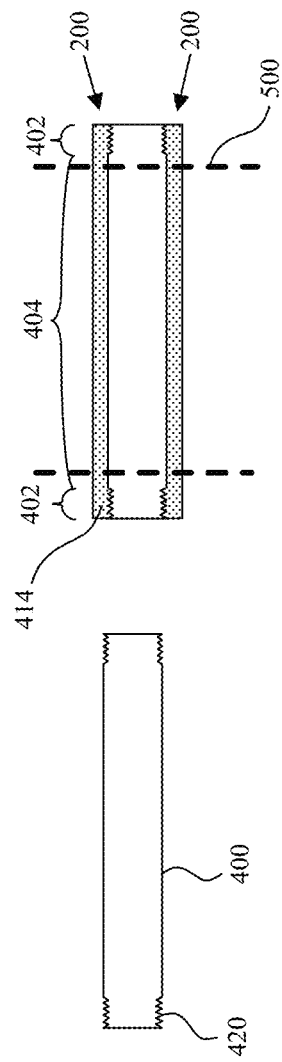
FIG. 21B

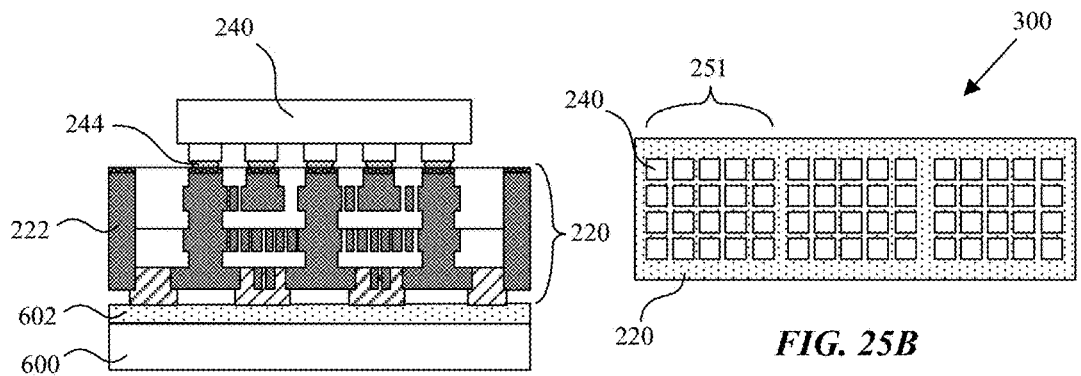
FIG. 25A
FIG. 25B
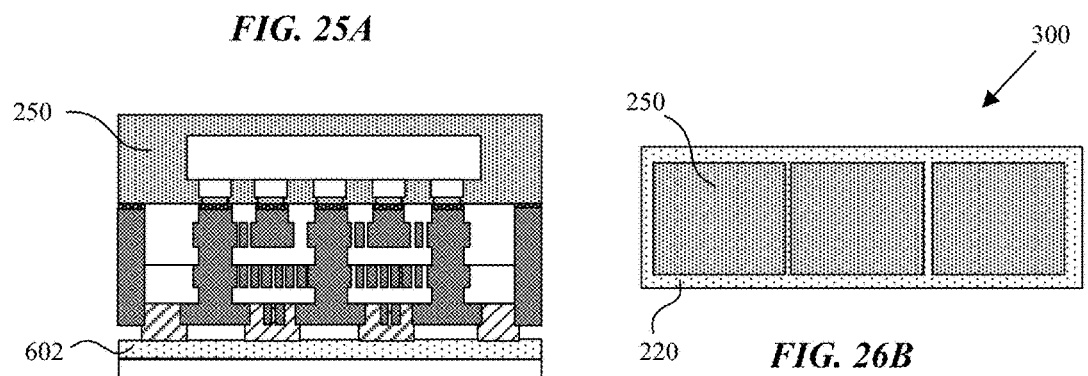
FIG. 26A
FIG. 26B
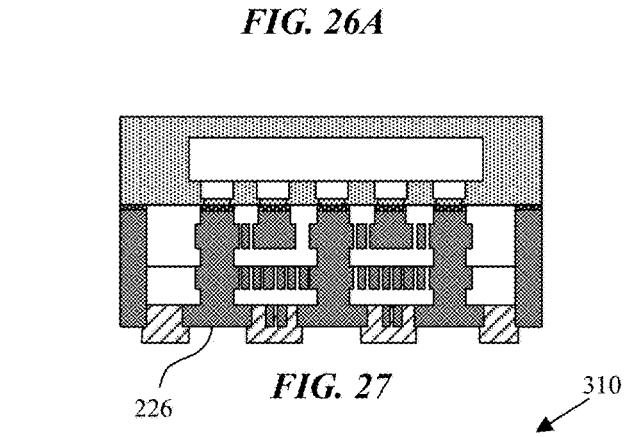
FIG. 27
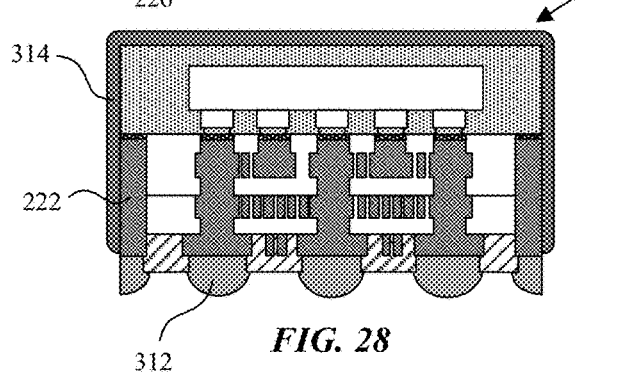
FIG. 28

CARRIER ULTRA THIN SUBSTRATE

BACKGROUND

Field

Embodiments described herein relate to electronic packaging. More particularly, embodiments relate to electronic packaging substrates.

Background Information

Plastic ball grid array (BGA) substrates are commonly used for memory, controller, and chipset applications amongst others. BGA substrates are commonly sold in the strip form, and characterized as rigid substrates that include a core, such as a resin layer reinforced with glass cloth, and build-up layers on opposite sides of the core. The build-up layers can be interconnected by through vias extending through the core layer. In response to the continued trend for higher density and lower profile (z-height) packages, for example, in mobile devices, recent packaging developments have investigated reduction of the core layer thickness as well as fabrication of coreless substrates.

SUMMARY

Methods of forming coreless substrates are described. In an embodiment, a method of forming a coreless substrate includes forming a debond layer on a carrier substrate. The debond layer includes a first surface area and a second surface area on the carrier substrate, the first surface area surrounds the second surface area, and the first surface area has greater adhesion to the carrier substrate than the second surface area. A build-up structure is then formed on the debond layer, spanning across the first surface area and the second surface area of the debond layer, and a support substrate is attached to the build-up structure opposite the carrier substrate. The substrate stack is then cut through the build-up structure, the second surface area of the debond layer, and the carrier substrate, which allows for the carrier substrate to then be detached from the build-up structure. In an embodiment the support substrate and build-up structure are additionally cut into a plurality of panels after at least partially removing the debond layer.

The debond layer may be formed using a variety of configurations. In one embodiment, forming the debond layer includes placing a metal foil onto the carrier substrate, and laminating a cap layer over and laterally around the metal foil on the carrier substrate. In one embodiment, forming the debond layer includes removing a portion of a metal layer around lateral edges of a carrier core, and forming a cap layer over and laterally around the metal layer on the carrier core. In one embodiment, forming the debond layer includes roughening an area of the carrier substrate, and forming a cap layer over the roughed area of the carrier substrate and a non-roughened area of the carrier substrate. An electrical short layer may also be formed as part of the debond layer or on the debond layer.

Depending upon the debond layer, cutting through the second surface area of the debond layer may include cutting through a variety of structures. In an embodiment, cutting through the second surface area of the debond layer includes cutting through the metal foil. In an embodiment, cutting through the second surface area of the debond layer includes cutting through the metal layer. In an embodiment, cutting through the second surface area of the debond layer includes cutting through the cap layer over the non-roughened area of the carrier substrate.

In one embodiment, forming the debond layer includes forming the electrical short layer. In such an embodiment attaching the support substrate to the build-up structure may include attaching the support substrate to a BGA side of the build-up structure comprising a plurality of BGA bond pads that are electrically shorted together with the electrical short layer. The debond layer may be at least partially removed after detaching the carrier substrate. In an embodiment, this includes removing the electrical short layer to expose a plurality of surface mount technology (SMT) bond pads.

In one embodiment, the electrical short layer is formed on the debond layer. In such an embodiment, the build-up structure is formed on the electrical short layer, and attaching the support substrate to the build-up structure may include attaching the support substrate to a BGA side of the build-up structure comprising a plurality of bond pads that are electrically shorted together with the electrical short layer. In an embodiment, the electrical short layer is removed to expose a plurality of SMT bond pads after at least partially removing the debond layer.

In an embodiment, a method of forming a coreless substrate includes forming an electrical short layer on a carrier substrate, and forming a build-up structure on the electrical short layer. The build-up structure includes a plurality of contact pads (e.g. BGA contact pads) on a front side of the build-up structure shorted to each other through the electrical short layer on a back side of the build-up structure. A support substrate is attached to the front side of the build-up structure. The carrier substrate is detached, the electrical short layer is removed, and a second plurality of contact pads (e.g. SMT contact pads) is exposed on the back side of the build-up structure. In an embodiment, after exposing the second plurality of contact pads the panel sized substrate stack is cut through the support substrate and build-up structure resulting to form a plurality of substrate strips.

In an embodiment, forming the electrical short layer includes placing a metal foil onto the carrier substrate, and laminating a cap layer over and laterally around the metal foil on the carrier substrate. In such an embodiment, the method may additionally include cutting through the metal foil, the cap layer, the build-up structure and the support substrate prior to detaching the carrier substrate. In an embodiment, forming the electrical short layer includes forming a cap layer on the carrier substrate, and forming a seed layer on the cap layer. In such an embodiment, the method may additionally include cutting through the cap layer, the seed layer, the build-up structure and the support substrate prior to detaching the carrier substrate.

In accordance with embodiments the BGA contact pads and SMT contact pads may be tested to verify "known good" substrates. In an embodiment, the plurality of contact pads (e.g. BGA contact pads) are tested to detect electrical opens prior to attaching the support substrate to the front side of the build-up structure; and the second plurality of contact pads (e.g. SMT contact pads) are tested to detect electrical shorts after exposing the second plurality of contact pads on the back side of the build-up structure.

In accordance with embodiments, ultra thin coreless substrate strips may be prepared. In an embodiment, a coreless substrate strip includes a support substrate including rectangular lateral dimensions, an adhesive layer on the support substrate, and a build-up structure attached to the adhesive layer. The build-up structure may include a bottom surface including a plurality of BGA contact pads, and a top surface including a plurality of surface mount contact pads. In an embodiment, the build-up structure is less than 100 μm thick. In an embodiment, the bottom surface of the build-up structure additionally includes ground routing. The build-up structure may include an array of package routings arranged in a series of strips, with each of the strips arranged in molding groups, and each package routing including a ground routing around a periphery of the package routing.

BRIEF DESCRIPTION OF THE DRAWINGS

FIG. 4-5 are schematic top view illustrations of a debond layer formed over a carrier substrate in accordance with an embodiment.

FIG. 6 is a schematic top view illustration of a build-up structure formed on a debond layer in accordance with an embodiment.

FIG. 7 is a cross-sectional side view illustration of a substrate strip taken along section X-X of FIG. 6 in accordance with an embodiment.

FIG. 8 is a cross-sectional side view illustration of a plurality of chips encapsulated on build-up structure FIG. 9 is a cross-sectional side view illustration of cutting through a debond layer in accordance with an embodiment.

FIG. 10 is a cross-sectional side view illustration of a debonded panel in accordance with an embodiment.

FIGS. 13A-15B are schematic top view and cross-sectional side view illustrations of a process of forming a debond layer including a metal foil in accordance with an embodiment.

FIGS. 19A-21B are schematic top view and cross-sectional side view illustrations of a process of forming a debond layer on a roughened surface in accordance with an embodiment.

FIG. 25A is a cross-sectional side view illustration of a die mounted on a build-up structure in accordance with an embodiment.

FIG. 25B is a schematic top view illustration of a strip substrate including plurality of package areas in accordance with an embodiment.

FIG. 26A is a cross-sectional side view illustration of a die encapsulated on a build-up structure in accordance with an embodiment.

FIG. 26B is a schematic top view illustration of a strip substrate including plurality of encapsulated package areas in accordance with an embodiment.

FIG. 27 is a cross-sectional side view illustration of a support substrate removed from a build-up structure in accordance with an embodiment.

FIG. 28 is a cross-sectional side view illustration of a package including solder bumps applied on a multiple-layer build-up structure in accordance with an embodiment.

DETAILED DESCRIPTION

Figure 1A:
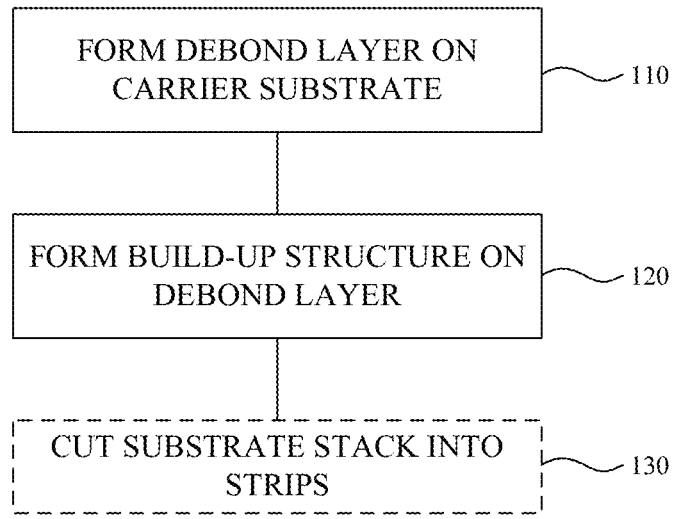
FIG. 1A is a flow chart illustrating a method of forming a build-up structure on a carrier substrate in accordance with an embodiment.

Embodiments describe ultra thin coreless substrate processing techniques. More specifically, embodiments describe coreless substrate processes that are compatible with BGA fabrication and shipment of substrate strips. For example, conventional BGA chip assembly is implemented in batch on a substrate strip including a series of package substrate areas reserved for the fabrication of individual or multiple BGA package units. Conventionally, the substrate strip is rectangularly-shaped.

In one aspect, embodiments describe coreless substrate fabrication processes that enable shipment of "known good" (i.e. verified electrical tests) coreless substrates on a support substrate (e.g. shipping substrate). Thus, the packaging processes can be "chip last" processes in which chips are only mounted onto "known good" substrates. In application this can increase assembly throughput, since the "known good" substrates can be prepared and stored prior to chip assembly. In accordance with embodiments, an electrical short layer can be formed on a carrier substrate, followed by formation of a build-up structure on the electrical short layer. In an embodiment, testing for electrical opens can be performed on BGA contact pads of the build-up structure. The carrier substrate may then be removed, followed by testing for electrical shorts on the exposed surface mount (SMT) contact pads of the build-up structure. The resultant "known good" substrates can be shipped in a variety of form factors, such as panel size, or strip substrate size compatible with BGA assembly tools.

In another aspect, embodiments describe coreless substrate fabrication processes that can be used for the fabrication and shipment of ultra thin substrates (e.g. build-up structures in strip form) each supported on, and readily releasable from, a support substrate. Thus, not only can the strip substrates be "known good" substrates, the releasable build-up structures can be much thinner than traditional coreless substrates. In some embodiments, the strip substrates may include a single layer build-up structure (1L, one metal layer) or multiple layer build-up structure (e.g. 3L, three metal layers). In an embodiment, a 3L build-up structure may be less than 60 μm thick, and a 1L build-up structure may be less than 20 μm thick. Furthermore, due to the thickness of the build-up structure (e.g. less than 100 μm thick) warpage concern is significantly mitigated.

In another aspect, embodiments describe coreless substrate fabrication processes in which a carrier substrate is debonded from a build-up structure after selective cutting through low adhesion areas of a debond layer that joins the build-up structure to the carrier substrate. In accordance with embodiments, the debond layer may include surface areas with different adhesion to the carrier substrate (e.g. high and low, respective to one another). In this manner, carrier substrate debonding can be achieved by processing (e.g. cutting) of selective areas as opposed to processing an entire layer, for example, as is customary with ultraviolet (UV), thermal, or laser debonding technology.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Figure 1B:
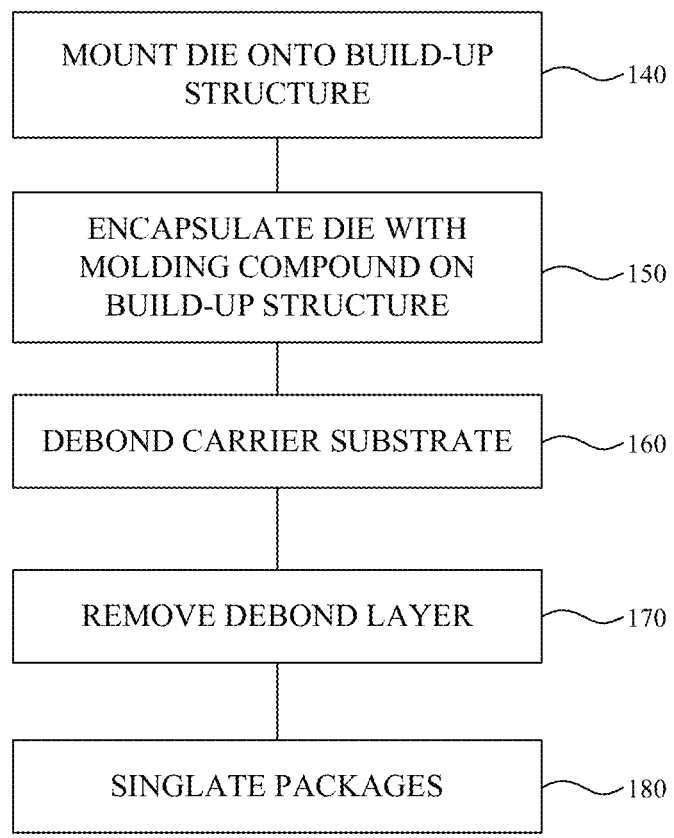
FIG. 1B is a flow chart illustrating a method of forming a package using a build-up structure formed on a carrier substrate in accordance with an embodiment.

FIG. 1A is a flow chart illustrating a method of forming a build-up structure on a carrier substrate in accordance with an embodiment. FIG. 1B is a flow chart illustrating a method of forming a package using a build-up structure formed on a carrier substrate in accordance with an embodiment. The sequences illustrated in FIGS. 1A-1B may be formed by a single actor, or performed by separate actors. For example, the sequence illustrated in FIG. 1A may be performed by a substrate manufacturer, while the sequence illustrated in FIG. 1B may be performed by a chip assembly manufacturer. Thus, the substrate manufactured in the sequence illustrated in FIG. 1A may be a shipped product, such as substrate strips for BGA chip assembly. In interest of clarity, the following description of FIGS. 1A-1B is made with regard to reference features found in other figures described herein.

Referring now to FIG. 1A, at operation 110 a debond layer 200 is formed on a carrier substrate 206. In an embodiment, the debond layer 200 includes a first surface area 202 and a second surface area 204 on the carrier substrate 206, with the first surface area 202 having greater adhesion (e.g. high tack) to the carrier substrate 206 than the second surface area 204 (e.g. low tack, air gap). A build-up structure 220 is then formed on the debond layer 200 at operation 120. The build-up structure 220 may span across the first surface area and the second surface area of the debond layer. The substrate stack (e.g. panel) including the build-up structure 220, debond layer 200, and carrier substrate 206 may then be optionally cut into substrate strips 300 at operation 130. In an embodiment, the substrate stack is cut through the second surface area 204, so that the build-up structure 220 is debonded from the carrier substrate 206 when cutting into substrate strips 300. In an embodiment, the substrate stack is cut through the first surface area 202 only, so that the build-up structure 220 is not debonded from the carrier substrate 206 when cutting into substrate strips 300. For example, the carrier substrate 206 may be useful as a shipping substrate, and for support during subsequent processing operations, for example with chip assembly. In accordance with embodiments, the substrate stack may be shipped as panel form or substrate strip form.

Referring now to FIG. 1B, at operation 140 one or more die 240 are mounted onto the build-up structure 220. The die 240 may include active components (e.g. logic, memory, system on chip, etc.) or passive components (e.g. capacitors or inductors, MEMS devices, sensors, etc.). The mounted die 240 may then be encapsulated with a molding compound 250 on the build-up structure 220 at operation 150. At operation 160 the carrier substrate 206 may be debonded. In an embodiment, the carrier substrate 206 is debonded by cutting through the second surface area 204 of the debond layer 200. The debond layer 200 may then be removed from the build-up structure 220 at operation 170, and individual packages 310 may be singulated at operation 180.

Figure 2:
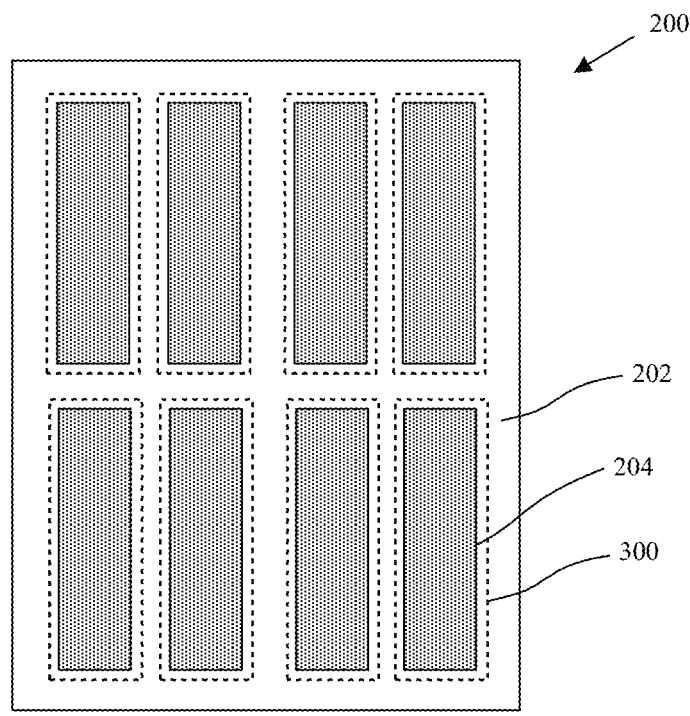
FIGS. 2-3 are schematic top view illustrations of debond layers formed over a carrier substrate in accordance with embodiments.
Figure 3:
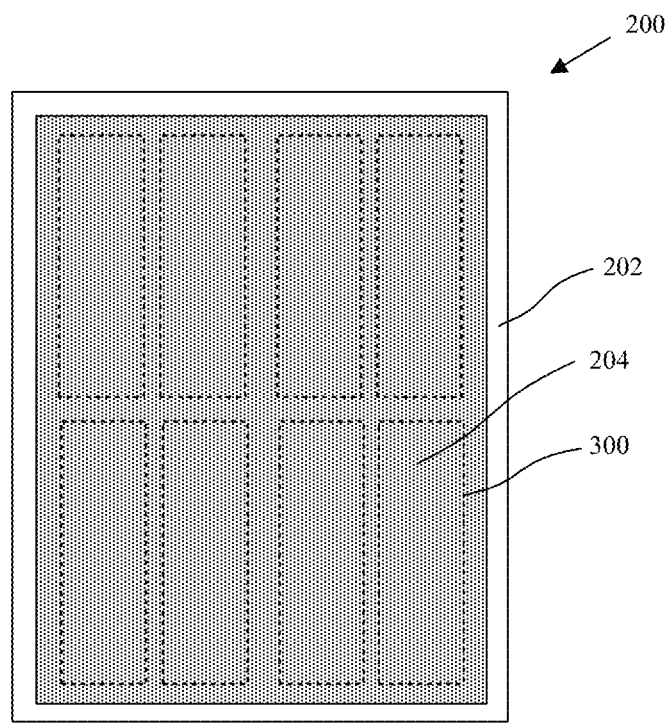

Referring now FIGS. 2-3 schematic top view illustrations are provided of debond layers 200 formed over a carrier substrate in accordance with embodiments. In both embodiments, the debond layer 200 includes a first surface area 202 and a second surface area 204 on the carrier substrate, the first surface area 202 surrounds the second surface area 204, and the first surface area 202 has greater adhesion to the carrier substrate than does the second surface area 204. In the embodiment illustrated in FIG. 2, there are a plurality of second surface areas 204, each surrounded by the first surface area 202. Substrate strip 300 outlines are illustrated in the particular embodiment around the second surface areas 204. In such an embodiment, a substrate stack (e.g. panel) including the build-up structure 220, debond layer 200, and carrier substrate 206 may be cut into substrate strips 300 at operation 130 without debonding the build-up structure 220 from the carrier substrate 206. In the embodiment illustrated in FIG. 3, there is a single second surface area 204 covering a majority of the carrier substrate (e.g. panel) area. In such an embodiment, a panel-sized build-up structure can be debonded from the carrier substrate 206, followed by subsequent cutting into individual substrate strips 300.

Referring now to FIGS. 4-6, schematic top view illustrations are provided for a method of forming a debond layer and build-up structure in accordance with an embodiment. FIG. 7 is a cross-sectional side view illustration of a substrate strip taken along section X-X of FIG. 6 in accordance with an embodiment. In the particular embodiments illustrated in FIGS. 4-7, a debond layer 200 including an anti-stick coating is illustrated. However, embodiments are not so limited and a variety of debond layers 200 can be utilized such as, but not limited to, those illustrated and described with regard to FIGS. 13A-21B. Additionally, a variety of carrier substrates 206 may be utilized in accordance with embodiments. For example, the carrier substrates may be prepreg, glass, metal (e.g. stainless steel), etc. The carrier substrates may come with or without a metal surface layer.

Referring now to FIG. 4, a plurality of second surface areas 204 is formed with a patterned sacrificial layer 212 over the carrier substrate 206. A patterned metal layer 210 (e.g. copper) may optionally be formed underneath the sacrificial layer 212. The sacrificial layer 212 may have anti-stick properties in order to form a low bond strength interface with the underlying layer (e.g. patterned metal layer 210). Exemplary materials may include polyvinyl fluoride (PVF), nickel, chromium. Exposed portions of the carrier substrate 206 may correspond to the first surface area 202 for forming a high bond strength interface.

A cap layer 414 may then be formed over the carrier substrate 206 and patterned sacrificial layer 212, and directly on both surface areas 202, 204. In an embodiment, cap layer 414 is formed of a dielectric material. In an embodiment, cap layer 414 is laminated. Following the formation of cap layer 414 a build-up structure 220 including an array of package routings 221 is formed over the cap layer 414. The build-up structure 220 and package routings 221 may include a single metal routing layer 224 (e.g. 1 L) or multiple metal routing layers 224 and dielectric layers 214. In the particular embodiment illustrated in FIG. 6, the build-up structure 220 is formed over both surface areas 202, 204, while the package routings 221 are formed over only the second surface areas 204. The package routings 221 may be arranged in a series of strips, and within each of the strips arranged in molding groups 251 which will subsequently support die that will be molded together within a single molding compound. Following the formation of the build-up structure 220, the substrate stack may optionally be cut through the first surface areas 202 to form a plurality of substrate strips 300.

FIG. 7 is a cross-sectional side view illustration of a substrate strip taken along section X-X of FIG. 6 in accordance with an embodiment. In the embodiment illustrated, in addition to the one or more metal routing layers 224 and dielectric layers 214, the build-up structure 220 may additionally include ground routing 222. The ground routing 222 may completely surround individual package outlines, or optionally only partially surround package outlines. In an embodiment, each package routing 221 includes a ground routing around a periphery of the package routing 221. For example, ground routing 222 may be a ground ring. In an embodiment, ground routing 222 is electrically isolated from package routing 221.

Referring now to FIGS. 8-10 the substrate stack in panel or strip form (e.g. substrate strip 300) is subjected to a chip assembly process. In the embodiment illustrated in FIG. 8, a plurality of die 240 are mounted on the multiple package routings 221 of the build-up structure 220. For example, the plurality of die 240 may be flip chip mounted, and bonded to the build-up structure 220 with solder joints. The die 240 are then encapsulated on the build-up structure 220 with a molding compound 250. Referring briefly to FIG. 6, separate locations of the molding compound 250 may be formed over multiple die 240 in molding groups 251. This is also illustrated in FIGS. 25B and 26B.

Referring now to FIG. 8, the substrate stack (e.g. substrate strip 300) is cut in order to debond the carrier substrate 206. As shown, the substrate stack is cut through the second surface areas 204 (e.g. low tack areas) including the sacrificial layer 212. After cutting the build-up structure 220 may be debonded (e.g. peeled) from the carrier substrate 206 and metal layer 210. Following debonding, the build-up structure 220 is processed to remove residual cap layer 414 and expose the contact pads 226 and ground routing 222 in the build-up structure 220. For example, residual cap layer 414 may be removed by plasma etching, or grinding. Solder bumps 312 may then be optionally applied to the exposed contact pads 226 and ground routing 222, and individual packages 310 may then be singulated, as shown in FIG. 10. In an embodiment, cutting or sawing is performed through the ground routing 222 and optional solder bumps 312 attached thereto so that the ground routing 222 is exposed on the cut side surfaces.

Figure 11:
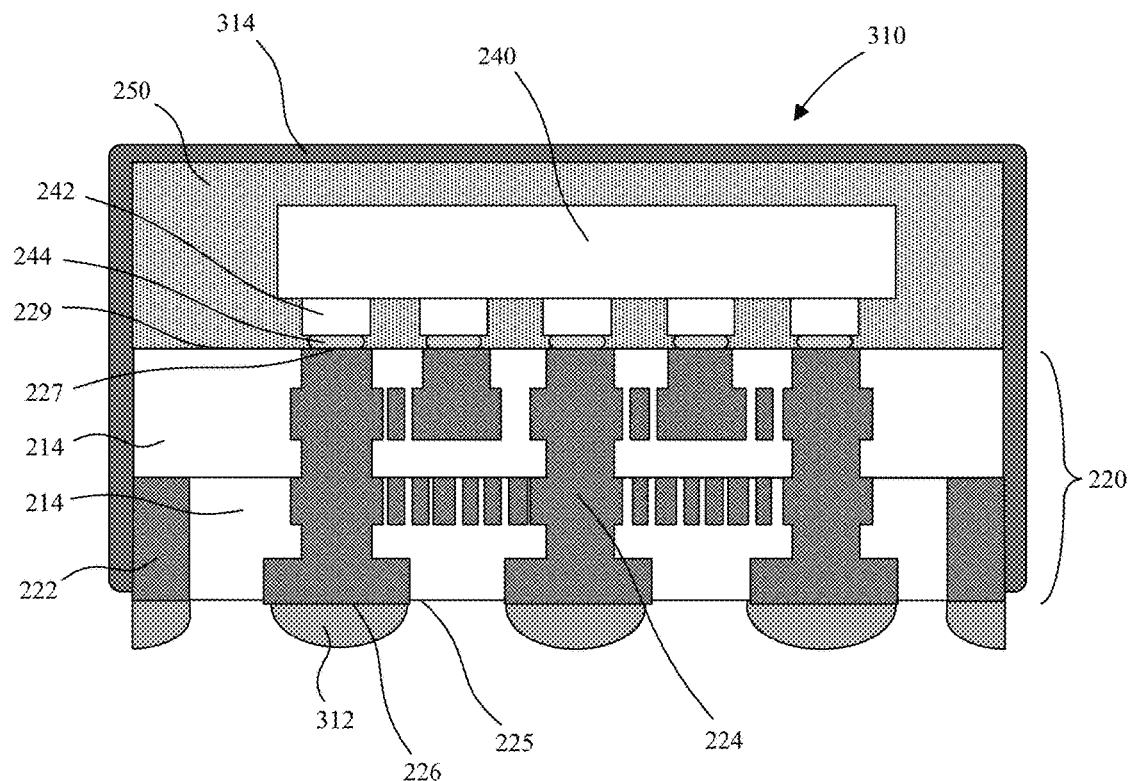
FIG. 11 is a cross-sectional side view illustration of a package including a multiple-layer build-up structure in accordance with an embodiment.
Figure 12:
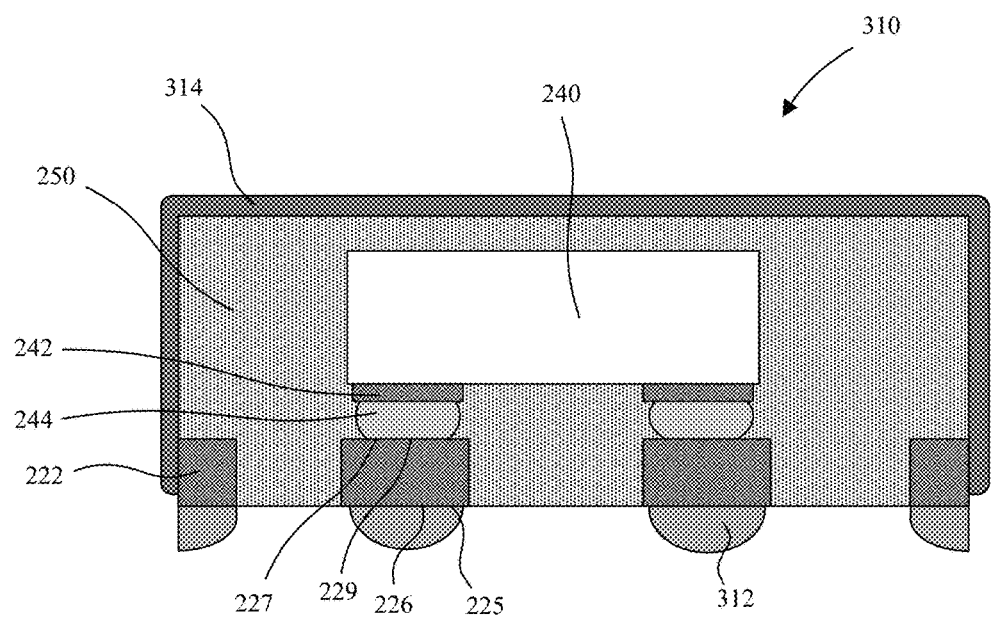
FIG. 12 is a cross-sectional side view illustration of a package including a single layer build-up structure in accordance with an embodiment.
Figure 18A:
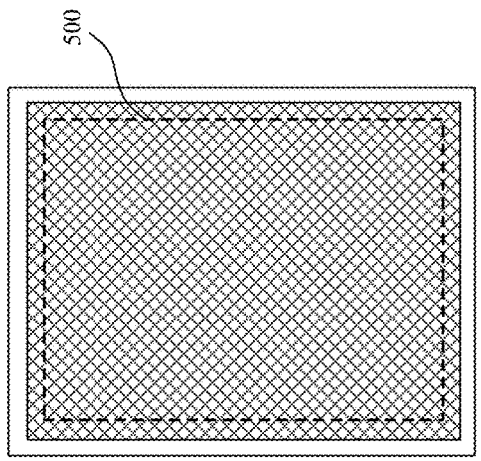
FIGS. 16A-18B are schematic top view and cross-sectional side view illustrations of a process of forming a debond layer including a sacrificial layer coating in accordance with an embodiment.
Figure 18B:
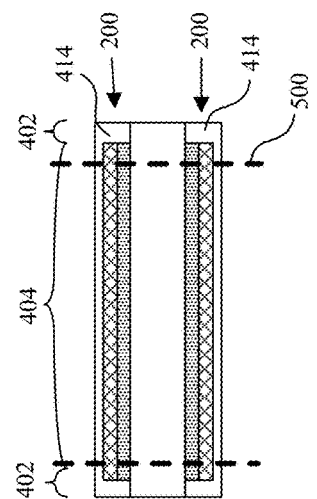
Figure 17A:
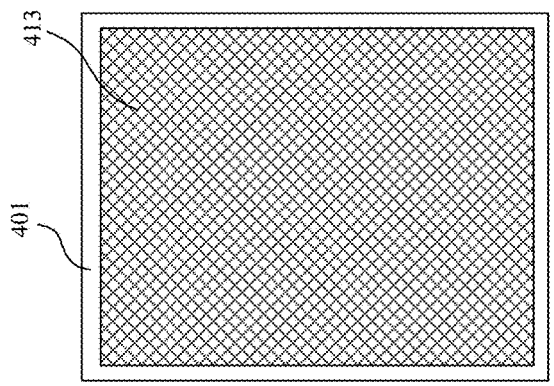
Figure 17B:
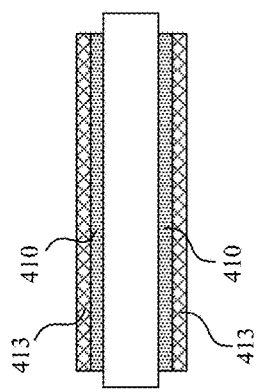
Figure 16A:
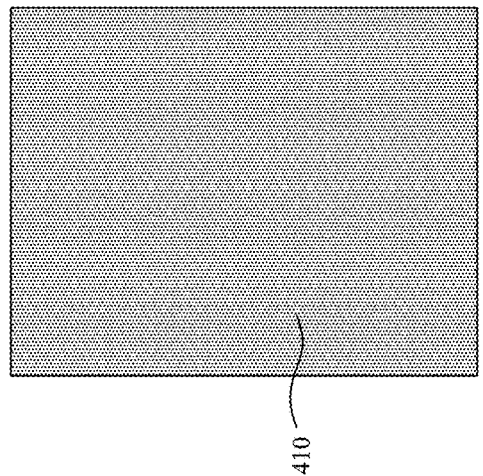
Figure 16B:
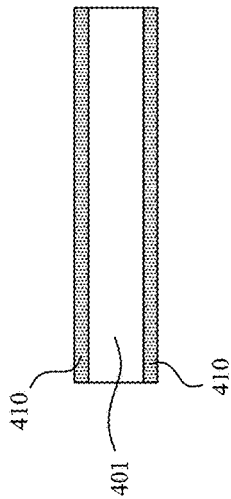

Exemplary multiple metal routing layer 224 package 310 and single metal routing layer 224 package 310 are illustrated in FIGS. 11-12. As shown, contact pads or studs 242 of die 240 may be bonded to the SMT contact pads 227 of top surface 229 the build-up structure 220 with solder joints 244. Solder 312 may optionally be applied to BGA contact pads 226 and ground routing 222 of the bottom surface 225 build-up structure 220. In an embodiment, an electrically conductive shielding 314 (e.g. metal layer) may be formed on the exposed side and top surfaces of the packages 310, for example, by sputtering for electromagnetic interference (EMI) shielding. Shielding 314 may be in electrical contact with ground routing 222. In an embodiment, after cutting or sawing to singulate the packages 310, the packages can be placed on another tape layer followed by sputtering to form the shielding 314. The solder 312 may be embedded in the tape layer during sputtering so that shielding 314 does not cover the solder 312. The packages 310 may then be removed from the tape layer.

In the above description, packaging methods are described and illustrated in which debond layer 200 includes a sacrificial layer (e.g. anti-stick coating). However, embodiments are not so limited and a variety of debond layers 200 can be utilized such as, but not limited to, those illustrated and described with regard to FIGS. 13A-21B. In the particular embodiments illustrated in FIGS. 13A-21B, the debond layers 200 include a first surface area 202 and a second surface area 204 on the carrier substrate 401, the first surface area 202 surrounds the second surface area 204, and the first surface area 202 has greater adhesion to the carrier substrate 401 than does the second surface area 204. In the embodiments illustrated, there is a single second surface area 204 covering a majority of the carrier substrate (e.g. panel) area. In such an embodiment, a panel-sized build-up structure can be debonded from the carrier substrate 401. Exemplary panel 500 outlines are illustrated by dashed lines. Alternatively, there may be a plurality of second surface areas 204, each surrounded by the first surface area 202 similarly as illustrated in FIG. 2.

Referring now to FIGS. 13A-15B schematic top view and cross-sectional side view illustrations are provided of a process of forming a debond layer 200 including a metal foil 412 in accordance with an embodiment. Carrier substrate 401 may be formed of the same materials as carrier substrate 206, and may optionally include conductive layers (e.g. metal layers) 410 on front and back surfaces. In an embodiment, carrier substrate 401 includes a carrier core (e.g. glass, metal) and metal layers 410 on one or both sides of the carrier core. For example, metal layers 410 may be formed of copper, and approximately 10-20 µm thick. In the embodiment illustrated, the metal foil 412 layers and cap layers 414 are booked and laminated on one or both sides of the carrier substrate 401, for example, using vacuum lamination. In an embodiment, metal foil 412 layers are copper, and approximately 10-20 µm thick. In an embodiment, cap layers 414 are formed of a suitable dielectric material such as poly(N-isopropylacrylamide-co-N,N-dimethylacrylamide) (PID), polybenzobisoxazole (PBO), epoxy Ajinomoto Build-up Film (ABF), etc. In an embodiment illustrated in FIGS. 13A-15B, there may be an air gap in the second surface area 204 between the metal foil layer 412 and metal layer 410 of the carrier substrate. In accordance with some embodiments, metal foil layers 412 may additionally function as electrical short layers, for example, during electrical open testing the BGA side of the build-up structure.

FIGS. 16A-18B are schematic top view and cross-sectional side view illustrations of a process of forming a debond layer 200 including a sacrificial (anti-stick) layer 413 coating in accordance with an embodiment. Carrier substrate 401 may be formed similarly as carrier substrate 401 described with regard to FIGS. 13A-15B. For example, carrier substrate 401 may include a carrier core (e.g. glass, metal) and metal layers 410 on one or both sides of the carrier core. As shown in FIGS. 17A-17B, sacrificial layer 413 may be coated onto the metal layers 410, followed by etching of the metal layers 410 at the lateral edges, or perimeter, of the carrier substrate 401 to expose the substrate core, which has a higher bonding strength capability than the sacrificial layer 413. The sacrificial layer 413 may have anti-stick properties in order to form a low bond strength interface with the underlying layer (e.g. patterned metal layer 210). Exemplary materials for sacrificial layer 413 may include polyvinyl fluoride (PVF), nickel, chromium. Exposed portions of the carrier substrate 401 may correspond to the first surface area 202 for forming a high bond strength interface.

A cap layer 414 may then be formed over the carrier substrate 401 and sacrificial layer 413, and directly on both surface areas 202, 204. In an embodiment, cap layer 414 is laminated.

FIGS. 19A-21B are schematic top view and cross-sectional side view illustrations of a process of forming a debond layer 200 on a roughened surface in accordance with an embodiment. Carrier substrate 401 may be a variety of materials including prepreg, glass, metal (e.g. stainless steel), etc. In an embodiment, carrier substrate 401 is a metal carrier, and may optionally have an anti-stick surface coating. In an embodiment, a perimeter area of the carrier substrate 401 is roughened using a suitable process such as jet blasting, laser etching, or chemical etching to for the first surface area 402. A cap layer 414 is then formed over the surface areas 402, 404 of the carrier substrate 401 using a suitable technique, such as vacuum lamination.

Figure 22A:
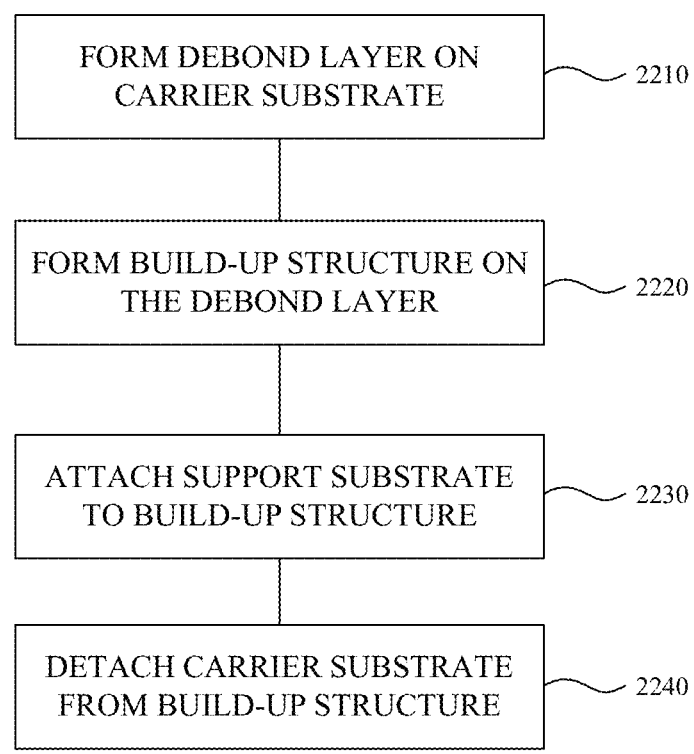
FIG. 22A is a flow chart illustrating a method of forming a build-up structure on a support substrate in accordance with an embodiment.
Figure 22B:
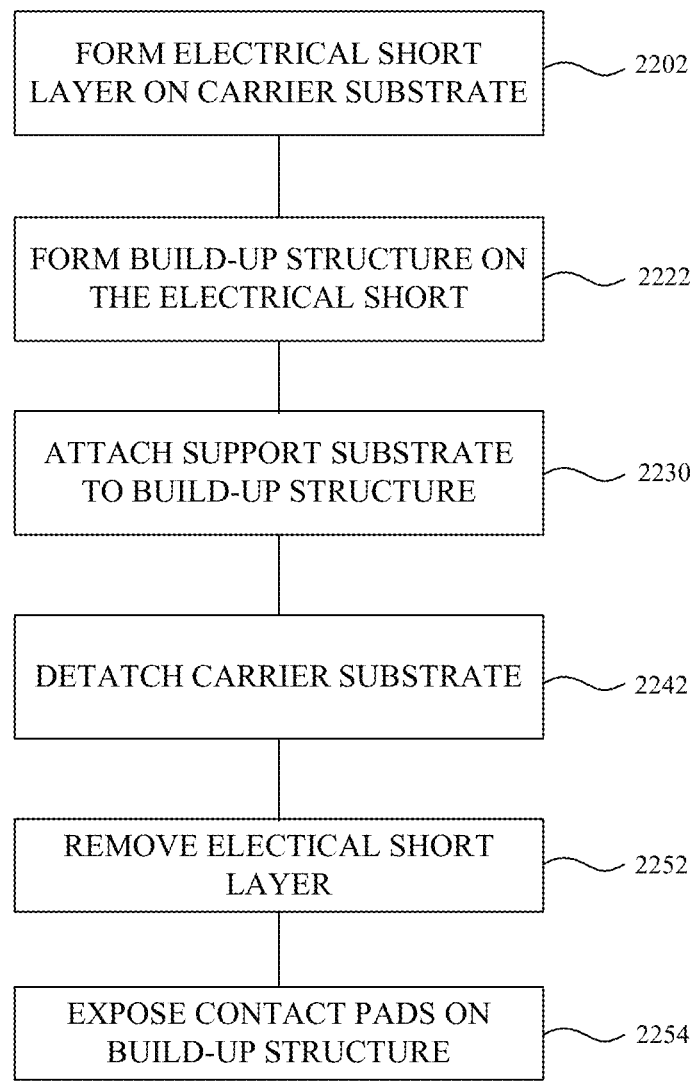
FIG. 22B is a flow chart illustrating a method of forming a build-up structure on a support substrate in accordance with an embodiment.

Referring now to FIGS. 22A-22B, flow charts are provided illustrating methods of forming a build-up structure on a support substrate. While the sequences are illustrated separately in FIGS. 22A-22B, one or more of the operations may be combinable. Thus, the sequences are not intended to be exclusive of one another, and may be interpreted as different ways of characterizing a same process. In interest of clarity, the following description of FIGS. 22A-22B is made with regard to reference features found in other figures described herein.

Referring to FIG. 22A, at operation 2210 a debond layer 200 is formed on a carrier substrate 401. In an embodiment, forming the debond layer 200 includes placing a metal foil 412 onto the carrier substrate 401 and laminating a cap layer 414 over and laterally around the metal foil 412 on the carrier substrate 401 as described above with regard to FIGS. 13A-15B. In an embodiment, forming the debond layer 200 includes removing a portion of a metal layer 410 around lateral edges of a carrier core, and forming a cap layer 414 over and laterally around the metal layer 410 on the carrier core as described above with regard to FIGS. 16A-18B. In an embodiment, forming the debond layer 200 includes roughening an area 420 of the carrier substrate 401, and forming a cap layer 414 over the roughened area of the carrier substrate 401 and a non-roughened area 400 of the carrier substrate 401. A build-up structure 220 is then formed on the debond layer 200 at operation 2220. A support substrate 600 is attached to the build-up structure at operation 2230, followed by detaching (debonding) the carrier substrate 401 from the build-up structure 220. Debonding of the carrier substrate 401 may include cutting through the second surface area 404 of the debond layer. In one embodiment, cutting through the second surface area 404 of the debond layer 200 includes cutting through the metal foil 412. In one embodiment, cutting through the second surface area 404 of the debond layer 200 includes cutting through the metal layer 210. In one embodiment, cutting through the second surface area 404 of the debond layer 200 includes cutting through the cap layer 414 over the non-roughened area 400 of the carrier substrate 401. Remaining residual debond layer 200 may then optionally be at least partially removed from the build-up structure 220 after debonding the carrier substrate 401.

Referring to FIG. 22B, at operation 2202 an electrical short layer is formed on a carrier substrate 401. In accordance with embodiments the electrical short layer may be formed as a part of the debond layer 200 or on the debond layer 200. For example, metal foil 412 may function as the electrical short layer. Alternatively, a seed layer 450 formed on the debond layer 200 may function as the electrical short layer. A build-up structure 220 is then formed on the electrical short layer at operation 2222. At this point, a test to detect electrical opens may be performed on the exposed contact pads 226 (e.g. BGA contact pads) of the build-up structure 220. In an embodiment, each of the exposed contact pads 226 are shorted together with the seed layer 450 or metal foil 412. In an embodiment, once testing is completed a support substrate 600 is attached to the build-up structure 220 at operation 2230. At operation 2242 the carrier substrate 401 is detached (debonded) from the build-up structure 220. The electrical short layer is removed from the build-up structure at operation 2252, and the contact pads 227 (e.g. SMT contact pads) on the build-up structure 220 are exposed at operation 2254. At this point, a test to detect electrical shorts may be performed on the exposed contact pads 227 (e.g. SMT contact pads) of the build-up structure 220. Panels 500 or substrate strips 300 passing the electrical tests may then be further processed as "known good" substrates.

Methods of forming a build-up structure 220 on a support substrate 600 are illustrated in FIGS. 23A-23G and FIGS. 24A-24G. FIGS. 23A-23G are cross-sectional side view illustrations of a method utilizing the debond layer 200 illustrated in FIGS. 13A-15B in accordance with an embodiment. FIGS. 24A-24G are cross-sectional side view illustrations of a method utilizing the debond layer 200 illustrated in either FIGS. 16A-18B or FIGS. 19A-21B. In the particular embodiments illustrated, the carrier substrates 401 are processed one both sides in order to fabricate two panels 500 from a single carrier substrate 401.

Figure 23A:
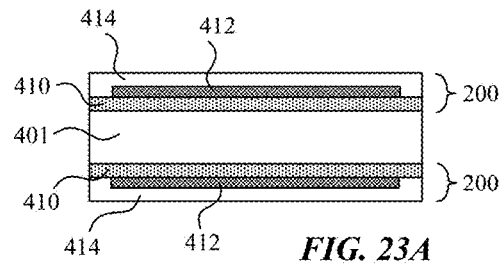
FIGS. 23A-23G are cross-sectional side view illustrations of a method of forming a build-up structure on a support substrate in accordance with an embodiment.
Figure 24A:
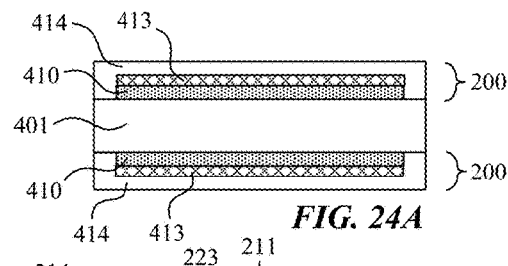
FIGS. 24A-24G are cross-sectional side view illustrations of a method of forming a build-up structure on a support substrate in accordance with an embodiment.
Figure 24B:
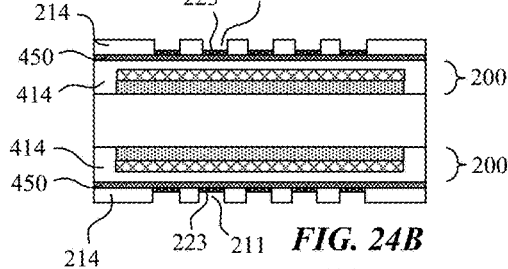

As shown in FIG. 23A debond layers 200 are formed on opposite sides of the carrier substrate 401 similarly as illustrated in FIGS. 13A-15B. As shown in FIG. 24A debond layers 200 are formed on opposite sides of the carrier substrate 401 similarly as illustrated in FIGS. 16A-18B. While the specific debond layers 200 from FIGS. 19A-21B are not separately shown in FIGS. 24A-24G, the processing sequences are substantially similar after the formation of debond layers 200.

Figure 23B:
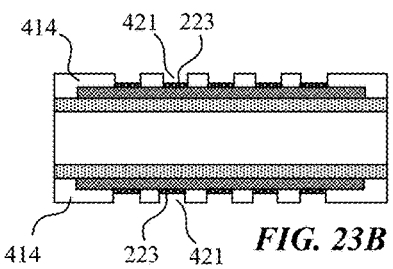

In the embodiment illustrated in FIG. 23B bump openings 421 are formed in the cap layer 414 using a suitable technique such as lithography or laser etching. A barrier metal layer 223 is then plated in the bump openings 421. For example, the barrier metal layer 223 may be a material such as Au, Ni/Au, or Cu. In the embodiment illustrated in FIG. 23 a seed layer 450 is formed over cap layer 414. For example, see layer may be Cu, and may be formed using a technique such as sputtering or electroless plating. A dielectric layer 214 may then be formed over the seed layer 450 and patterned to form bump openings 211. A barrier metal layer 223 is then plated in the bump openings 211. For example, the barrier metal layer 223 may be a material such as Au, Ni/Au, or Cu.

Figure 23C:
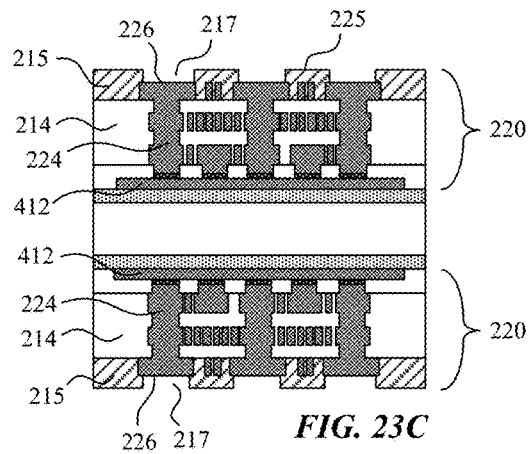
Figure 23D:
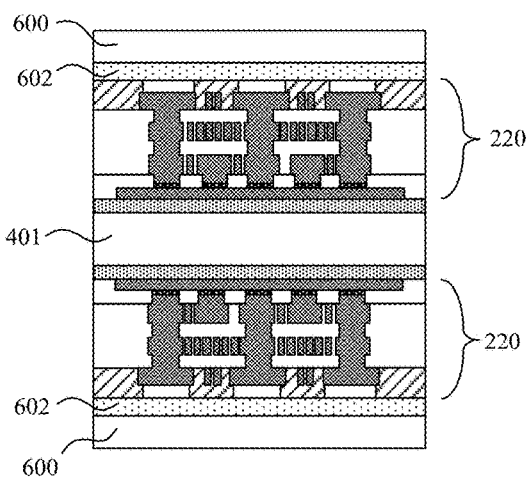
Figure 24C:
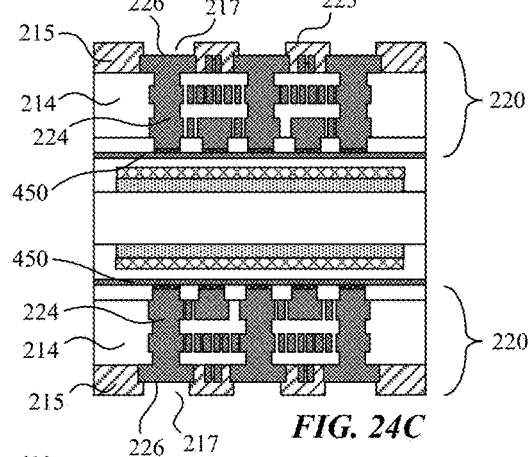
Figure 24D:
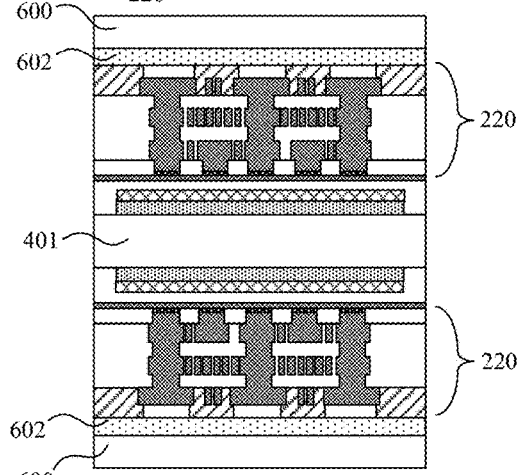
Figure 24E:
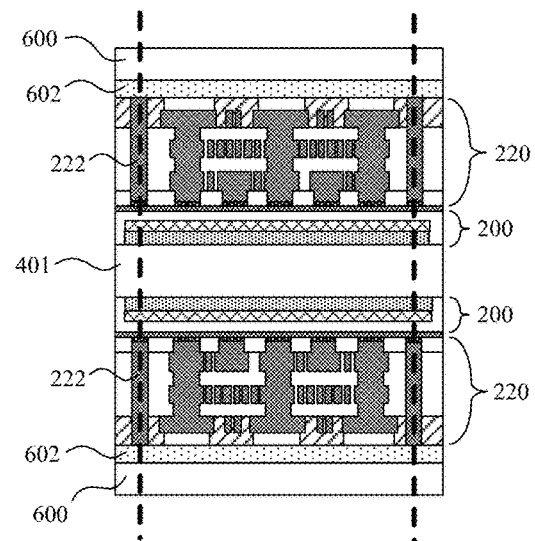
Figure 24F:
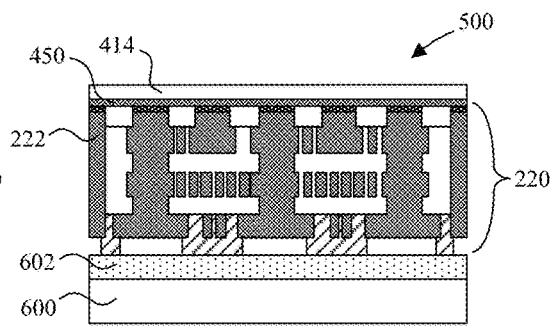

Sequential build-up processes of metal routing layers 224 and dielectric layers 214 may then be performed to form the build-up structure 220 as illustrated in FIG. 23C and FIG. 24C. Optionally, a BGA side passivation layer 215 may be formed, including openings 217 exposing contact pads 226 (e.g. BGA contact pads). Passivation layer 215 may be formed of the same or different materials than dielectric layers 214. At this point, a test to detect electrical opens may be performed on the exposed contact pads 226 (e.g. BGA contact pads) of the bottom surface 225 of the build-up structures 220. In an embodiment, each of the exposed contact pads 226 are shorted together with the seed layer 450 or metal foil 412. In an embodiment, once testing is completed support substrates 600 are attached to the build-up structures 220. As illustrated in FIGS. 23D and 24D, support substrates 600 may be attached using adhesive layers 602.

Figure 23E:
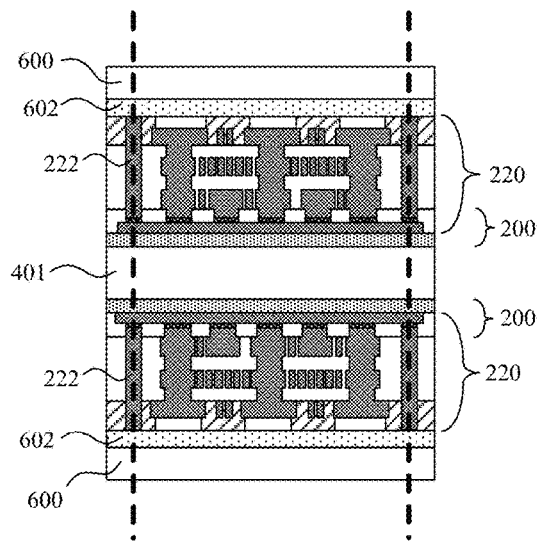
Figure 23F:
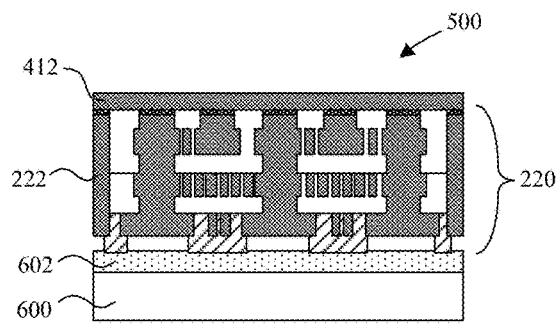
Figure 23G:
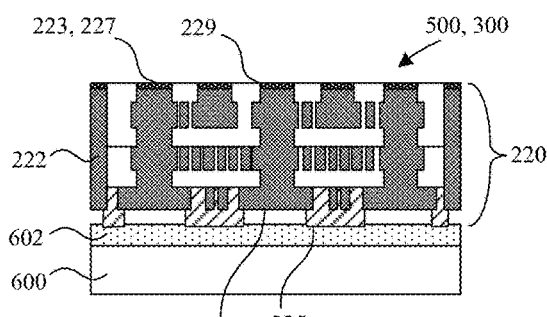
Figure 24G:
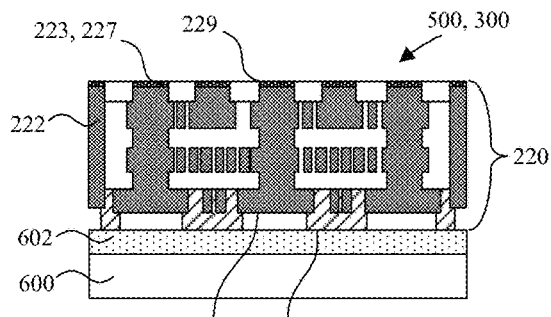

Referring now to FIGS. 23E-23G and FIGS. 24E-24G, the top and bottom panels 500 are debonded from the carrier substrate 401 by cutting through the second surface area 404. In the embodiment illustrated in FIG. 23F, the metal foil 412 (portion of debond layer 200) may be retained on the build-up structure 220 after debonding. The metal foil 412 may then be removed as illustrated in FIG. 23G by etching to reveal contact pads 227 (eg. SMT contact pads). In the embodiment illustrated in FIG. 24F, the seed layer 450 and cap layer 414 (portion of debond layer 200) may be retained on the build-up structure 220 after debonding. In an embodiment, the cap layer 414 is removed by plasma etching followed by micro etching to remove the seed layer 450 to reveal contact pads 227 (eg. SMT contact pads), as illustrated in FIG. 24G. The resultant panels in FIGS. 23G and 24G may then be singulated into substrate strips 300. At this point, a test to detect electrical shorts may be performed on the exposed contact pads 227 (e.g. SMT contact pads) of the top surface 229 of the build-up structure 220. Panels 500 or substrate strips 300 passing the electrical tests may then be further processed as "known good" substrates.

Referring now to FIGS. 25A-28 cross-sectional side view and schematic top view illustrations are provided for a chip assembly process on a substrate strip 300, similar to that previously described with regard to FIG. 1B. FIG. 25A is a cross-sectional side view illustration of a die mounted on a build-up structure in accordance with an embodiment. FIG. 25B is a schematic top view illustration of a strip substrate including plurality of package areas in accordance with an embodiment. As shown a plurality of die 240 are mounted onto the build-up structure 220. Similar to the above description with regard to FIG. 8, a plurality of die 240 are mounted on the multiple package routings 221 of the build-up structure 220. For example, the plurality of die 240 may be flip chip mounted, and bonded to the build-up structure 220 with solder joints 244. In the embodiment illustrated, multiple die 240 are arranged in molding groups 251 which will each be encapsulated with the same molding compound.

FIG. 26A is a cross-sectional side view illustration of a die encapsulated on a build-up structure in accordance with an embodiment. FIG. 26B is a schematic top view illustration of a strip substrate including plurality of encapsulated package areas in accordance with an embodiment. As shown in FIG. 26B, separate locations of the molding compound 250 are formed over multiple die 240 in the molding groups 251.

Following encapsulation, the build-up structure 220 may be debonded (e.g. peeled) from the adhesive layer 602 that held the build-up structure 220 on the support substrate 600. Solder bumps 312 may then be optionally applied to the exposed contact pads 226 and ground routing 222 as shown in FIG. 27, and individual packages 310 may then be singulated, as shown in FIG. 28. In an embodiment, cutting or sawing is performed through the ground routing 222 and optional solder bumps 312 attached thereto so that the ground routing 222 is exposed on the cut side surfaces. In an embodiment, an electrically conductive shielding 314 (e.g. metal layer) may be formed on the exposed side and top surfaces of the packages 310 including the ground routing 222, for example, by sputtering for EMI shielding, similarly as described with regard to FIGS. 11-12.

In utilizing the various aspects of the embodiments, it would become apparent to one skilled in the art that combinations or variations of the above embodiments are possible for forming a carrier ultra thin substrate. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A method of forming a coreless substrate comprising:
   forming a debond layer on a carrier substrate, wherein the debond layer includes a first surface area and a second surface area on the carrier substrate, the first surface area surrounds the second surface area, and the first surface area has greater adhesion to the carrier substrate than the second surface area;
   forming a build-up structure on an electrical short layer, and spanning across the first surface area and the second surface area of the debond layer, wherein the build-up structure comprises a first plurality of contact pads on a front side of the build-up structure, and a second plurality of contact pads on a back side of the build-up structure, and forming the build-up structure comprises forming the second plurality of contact pads directly on the electrical short layer;
   attaching a support substrate to the build-up structure opposite the carrier substrate;
   cutting through the build-up structure, the second surface area of the debond layer, and the carrier substrate;
   detaching the carrier substrate from the build-up structure, wherein the support substrate remains attached to the build-up structure; and
   after detaching the carrier substrate from the build-up structure, removing the electrical short layer to expose the second plurality of contact pads.

2. The method of claim 1, further comprising cutting the support substrate and the build-up structure into a plurality of panels after at least partially removing the debond layer.

3. The method of claim 1, wherein the electrical short layer comprises a metal foil, and forming the debond layer comprises:
   placing the metal foil onto the carrier substrate; and
   laminating a cap layer over and laterally around the metal foil on the carrier substrate.

4. The method of claim 3, wherein cutting through the second surface area of the debond layer comprises cutting through the metal foil.

5. The method of claim 1, wherein the electrical short layer comprises a metal layer, and forming the debond layer comprises:
removing a portion of the metal layer around lateral edges of a carrier core; and
forming a cap layer over and laterally around the metal layer on the carrier core.

6. The method of claim 5, wherein cutting through the second surface area of the debond layer comprises cutting through the metal layer.

7. The method of claim 1, wherein forming the debond layer comprises:
roughening an area of the carrier substrate; and
forming a cap layer over the roughened area of the carrier substrate and a non-roughened area of the carrier substrate.

8. The method of claim 7, wherein cutting through the second surface area of the debond layer comprises cutting through the cap layer over the non-roughened area of the carrier substrate.

9. The method of claim 1:
wherein forming the debond layer comprises forming the electrical short layer; and
attaching the support substrate to the build-up structure comprises attaching the support substrate to the back side of the build-up structure comprising the second plurality of contact pads that are electrically shorted together with the electrical short layer, wherein the second plurality of contact pads is a plurality of BGA bond pads.

10. The method of claim 9, wherein at least partially removing the debond layer comprises removing the electrical short layer to expose the first plurality of contact pads, wherein the first plurality of contact pads is a plurality of surface mount bond pads.

11. The method of claim 1:
further comprising forming the electrical short layer on the debond layer; and
attaching the support substrate to the build-up structure comprises attaching the support substrate to the back side of the build-up structure comprising the second plurality of contact pads that are electrically shorted together with the electrical short layer, wherein the second plurality of contact pads is a plurality of BGA bond pads.

12. The method of claim 11, further comprising removing the electrical short layer to expose the first plurality of contact pads after at least partially removing the debond layer, wherein the first plurality of contact pads is a plurality of surface mount bond pads.

13. The method of claim 1, further comprising:
testing the plurality of contact pads to detect electrical opens prior to attaching the support substrate to the front side of the build-up structure; and
testing the second plurality of contact pads to detect electrical shorts after exposing the second plurality of contact pads on the back side of the build-up structure.

14. The method of claim 1, wherein forming the debond layer comprises:
placing the electrical short layer onto the carrier substrate; and
laminating a cap layer over and laterally around the electrical short layer on the carrier substrate.

15. The method of claim 1:
further comprising forming the electrical short layer on the debond layer.

16. The method of claim 15, wherein forming the debond layer comprises:
forming a sacrificial layer over the carrier substrate; and
laminating a cap layer over and laterally around the sacrificial layer on the carrier substrate.

17. The method of claim 1, wherein forming the build-up structure comprises forming a plurality of ground routings and a plurality of package routings, wherein each ground routing surrounds a corresponding package routing.

* * * * *